United States Patent [19]

Hingorany

[11] Patent Number: 5,001,299
[45] Date of Patent: Mar. 19, 1991

[54] EXPLOSIVELY FORMED ELECTRONIC PACKAGES

[75] Inventor: Prem R. Hingorany, Broomfield, Colo.

[73] Assignee: Explosive Fabricators, Inc., Louisville, Colo.

[21] Appl. No.: 360,068

[22] Filed: Jun. 1, 1989

Related U.S. Application Data

[63] Continuation-in-part of Ser. No. 338,849, Apr. 17, 1989, which is a continuation-in-part of Ser. No. 318,157, Mar. 2, 1989.

[51] Int. Cl.[5] .............................................. H01L 23/02
[52] U.S. Cl. ..................................... 174/52.4; 357/74
[58] Field of Search .................. 174/52.1, 52.2, 52.3, 174/52.4; 357/72, 74, 75

[56] References Cited

U.S. PATENT DOCUMENTS

| | | |
|---|---|---|
| 3,320,351 | 5/1967 | Glickman . |
| 3,614,827 | 10/1971 | Knop et al. . |
| 3,826,953 | 7/1974 | Le Gales . |
| 3,936,864 | 2/1976 | Benjamin . |
| 3,943,557 | 3/1976 | Frazee et al. . |
| 4,266,089 | 5/1981 | Scherer . |
| 4,506,108 | 3/1985 | Kersch et al. ..................... 174/52.4 |
| 4,649,299 | 3/1987 | Scherer et al. . |
| 4,760,440 | 7/1988 | Bigler et al. . |
| 4,761,518 | 8/1988 | Butt et al. ........................... 174/52.4 |
| 4,780,572 | 10/1988 | Kondo et al. ........................ 74/52.4 |

Primary Examiner—Leo P. Picard
Assistant Examiner—Bot Lee Ledynh
Attorney, Agent, or Firm—Fields, Lewis, Pittenger & Rost

[57] ABSTRACT

In one embodiment, a microwave package is constructed from a block of aluminum having layers of material clad to opposite sides thereof having a lower coefficient of thermal expansion than the aluminum block. A receptacle is formed by milling away a portion of one of the layers and a large portion of the aluminum while maintaining an aluminum base or floor within the receptacle. Ceramic substrates can be attached to the floor and connected to wires which extend through feedthrough openings either in the aluminum side walls of the receptacle or through the clad material. A cover can be hermetically attached, as by welding, to the layer of clad material to complete the microwave package assembly. An alternative form of the invention, a metal matrix material can be used which has a layer of copper or aluminum clad to the top surface. The microwave package is formed by milling away a portion of this top surface to form the container. A top cover is provided which is of the same material as the clad layer which facilitates easy welding or attachment thereto.

12 Claims, 3 Drawing Sheets

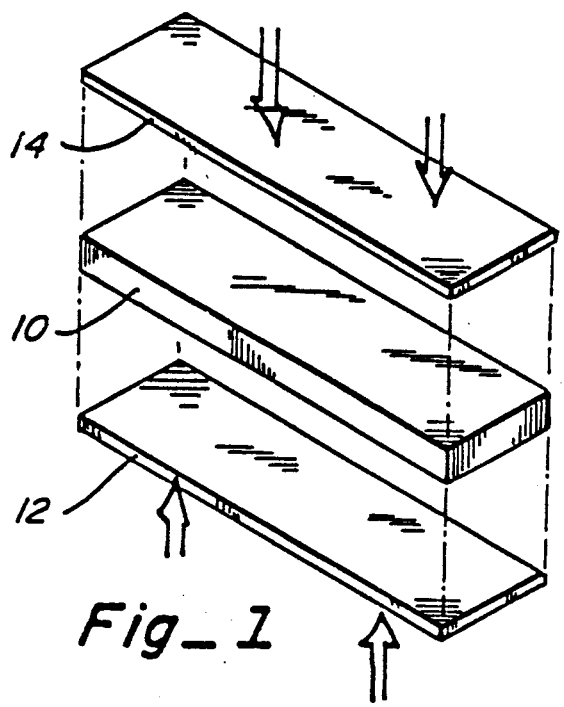
Fig_1
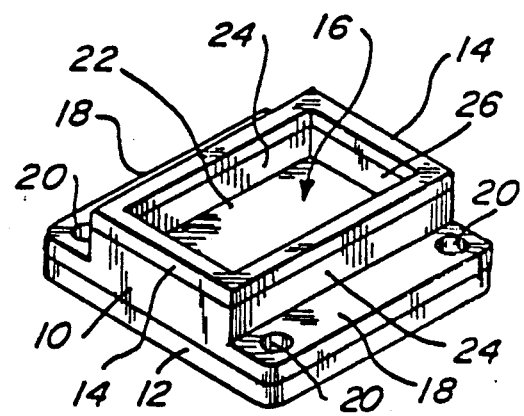
Fig_4
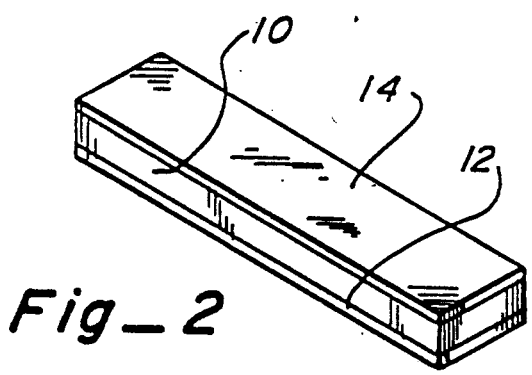
Fig_2
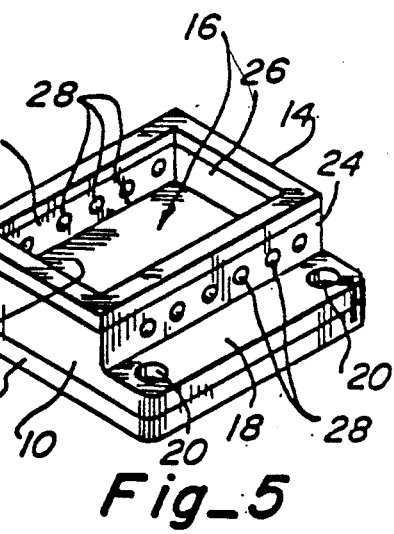
Fig_5
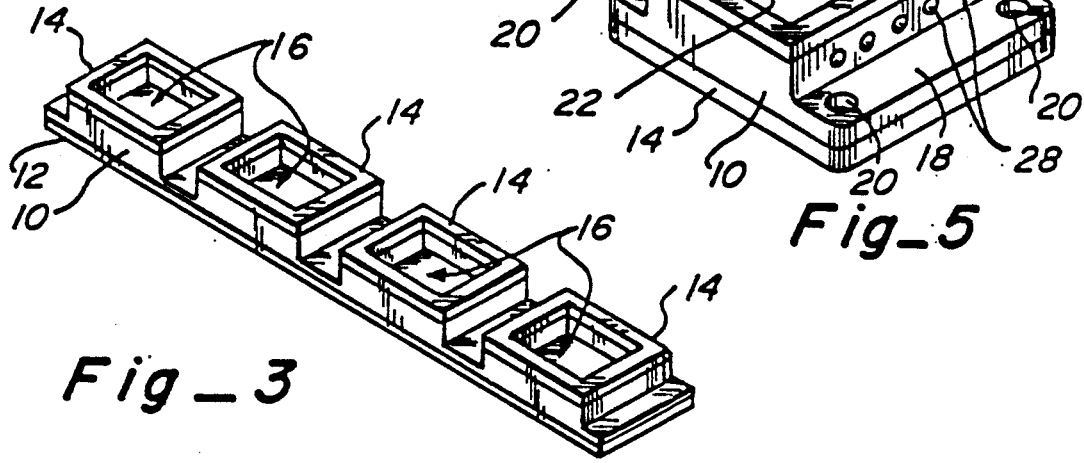
Fig_3

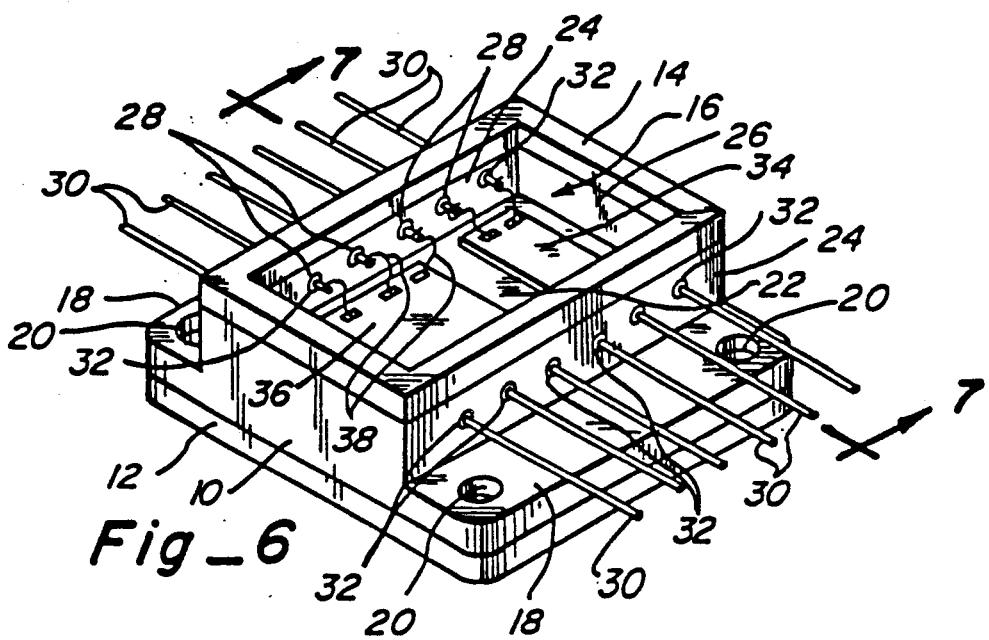
Fig_6
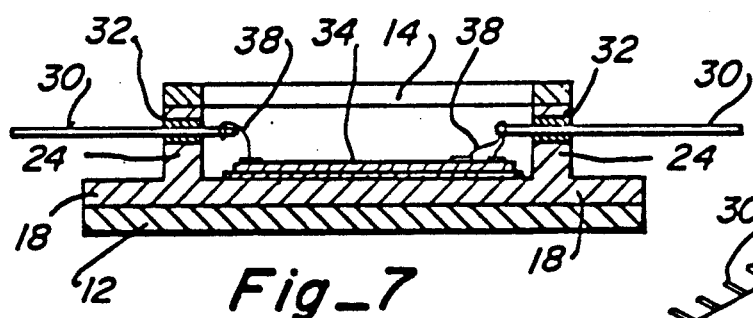
Fig_7
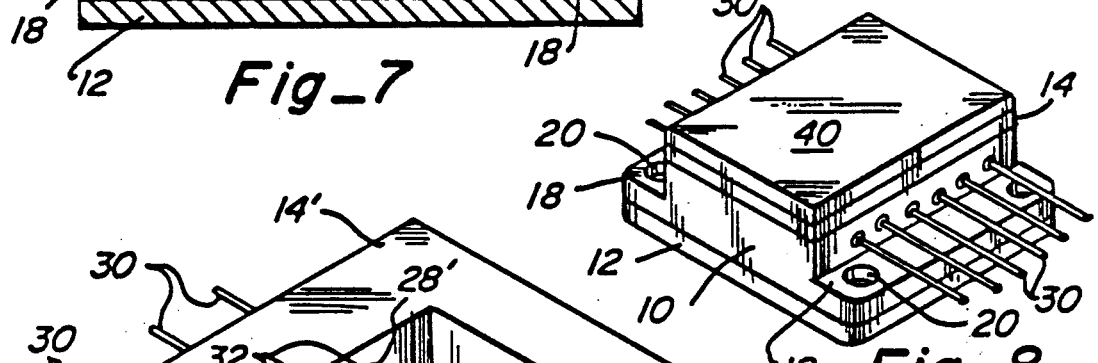
Fig_8
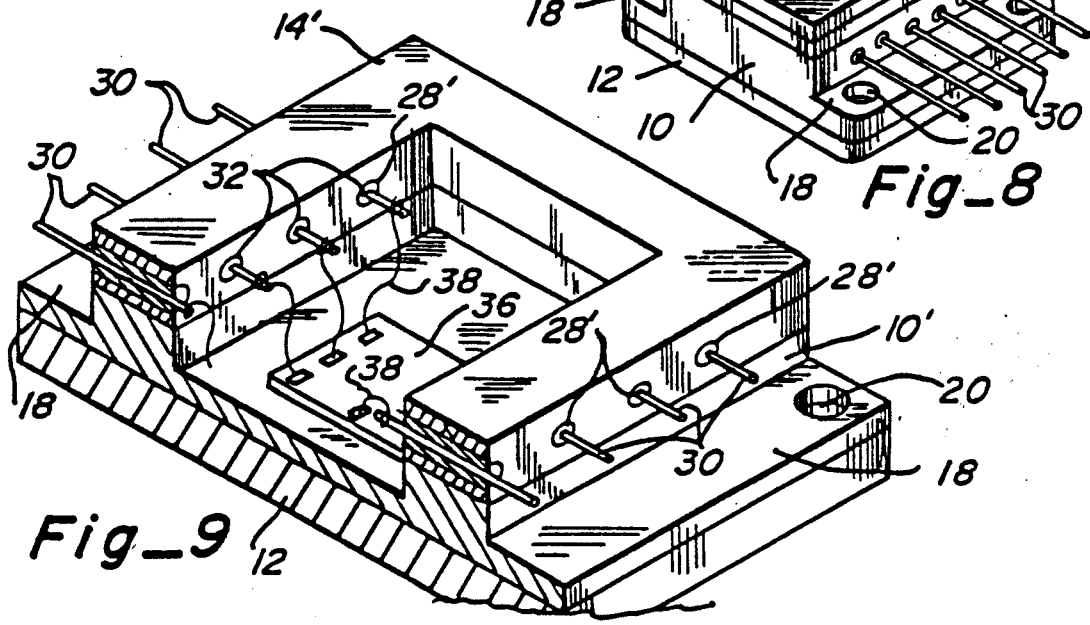
Fig_9

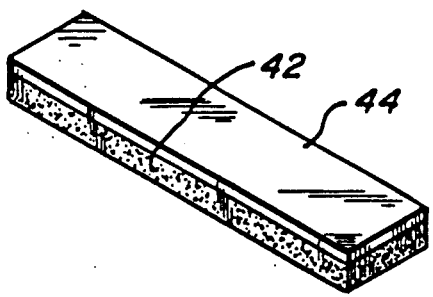
Fig_10
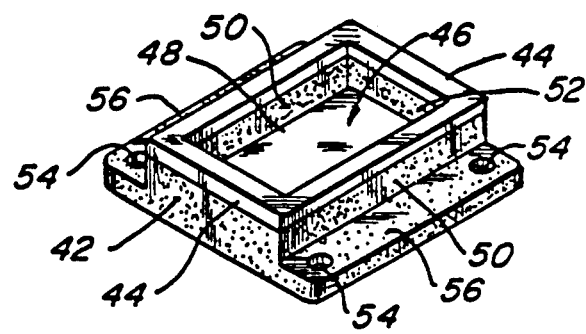
Fig_11
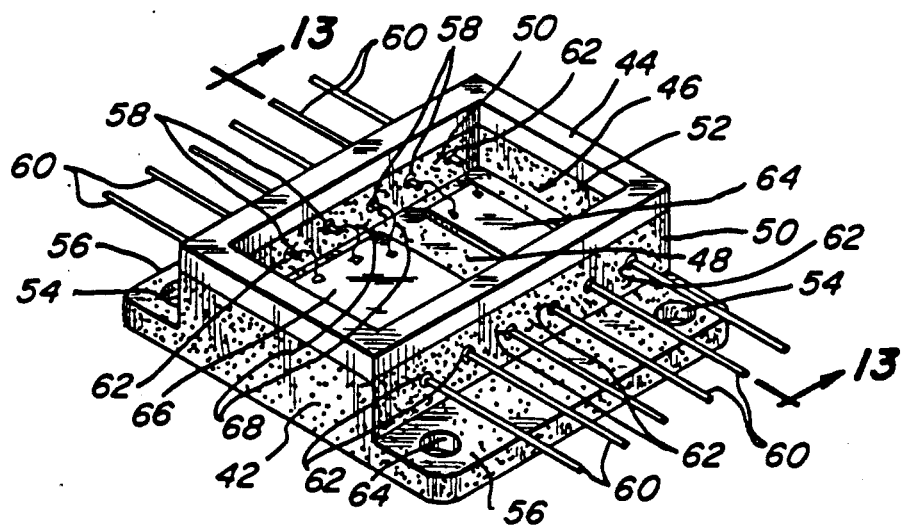
Fig_12
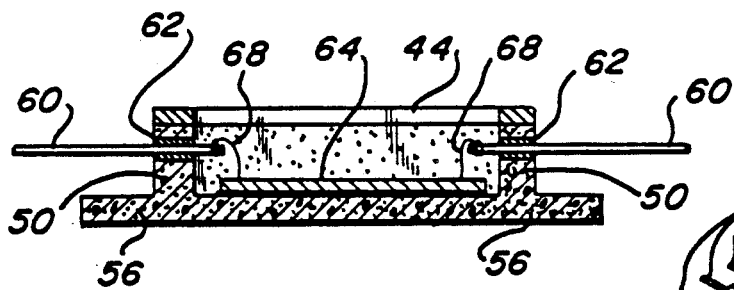
Fig_13
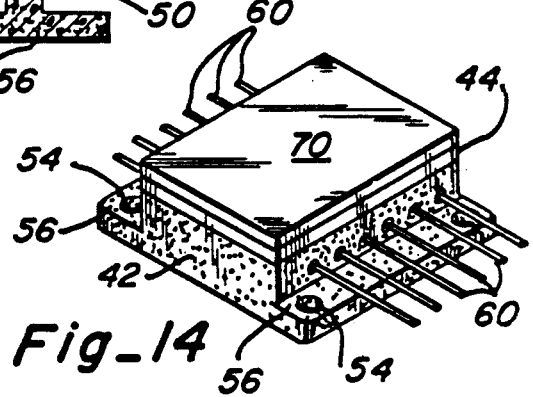
Fig_14

EXPLOSIVELY FORMED ELECTRONIC PACKAGES

This application is a continuation-in-part application of my copending U.S. Pat. application Ser. No. 338,849, filed Apr. 17, 1989, which in turn is a continuation-in-part of my copending U.S. Ser. No. 318,157, filed Mar. 2, 1989.

TECHNICAL FIELD

This invention relates to the fabrication of aluminum microwave electronic packages in one form of the invention and more particularly to such packages which are explosively clad with a thin layer of material having a small coefficient of thermal expansion as compared to aluminum Another form of the invention relates to the fabrication of power hybrid and microwave electronic packages and more particularly to such packages formed from a metal matrix material to which are explosively clad with a thin layer of monolithic material.

BACKGROUND ART

Microwave electronic packages are usually produced from aluminum alloys due to low weight and good thermal dissipation. However, one of the major disadvantages of aluminum alloys is their high expansion. The electronic components mounted on a substrate, usually ceramic, are placed inside the metallic enclosure. The high expansion of aluminum alloys creates stress in the ceramic which could result in cracking of the ceramic. Typically, the industry uses epoxy to attach ceramic to a metal base. Epoxy offers sufficient compliancy but only for small packages, such as 2"×3" type. As the package size keeps growing, the expansion mismatch becomes unacceptable.

Also, aluminum alloy packages offer significant difficulties in finally attaching a cover to the enclosures in a hermetic fashion. This is because aluminum and its alloys do not have good solderability, brazeability and weldability. Due to this same drawback, the attachment of prefabricated glass feed-throughs is also difficult which results in loss of hermeticity during manufacture or in use due to thermal fluctuations.

In the current art of building microwave packages, high strength aluminum alloys like 6061 T6 are machined to produce a package consisting of a base, side walls and holes drilled in the side walls for installing feed-throughs for wire leads. The feed-throughs consist of a Kovar lead, with glass sealed to the inner diameter of a Kovar ring. The glass sealing in the feed-throughs electrically separates the leads from the body, as well as ensuring a hermetic seal. The microwave packages are typically electroplated with silver or gold with a nickel underlayer. The electroplating serves the purpose of providing solderability/brazeability to aluminum surface and prevents the corrosion of the aluminum. These machined and electroplated packages are then installed with feed-throughs by using 80% gold-20% tin braze alloy at 325° C. to braze the inside of the plated hole and outside of the Kovar ring of the feed-through. An electroplated seal ring consisting of Kovar or stainless steel is also brazed to provide seam sealing capability for the cover, at the same time the feed-throughs are brazed.

The package now is ready to accept a circuit carrying ceramic card. In most cases, the ceramic cards are soldered or epoxied onto a carrier plate prior to epoxying/soldering the carrier plate inside the package. The carrier plates minimize the effect of expansion mismatch between the package and the ceramic card and tend to prevent the warping or cracking of the ceramic card or in some cases the detachment of ceramic card from the base of the package. This is because a aluminum and its alloys have a high coefficient of thermal expansion (22 ppm/°C.) compared to the ceramic card at 7 ppm/°C. The carrier plates consisting of Kovar (7 ppm/°C.) or stainless steel (12 ppm/°C.) offer a compromise situation and hence are used as transition materials. The disadvantages, of the type of carrier plates are excess weight and a significant thermal barrier as both stainless steel and Kovar are of low thermal conductivity. Also, the brazing of Kovar for the stainless steel seam sealing ring presents a problem due to voids, leaching of electroplated material at brazing temperature etc., often resulting in leaky packages.

In a recent development, some package manufacturers have attempted to build microwave packages from silicon carbide filled aluminum metal matrix materials. These metal matrix materials offer reduced coefficient of thermal expansion (8–12 ppm/°C.). However, due to carbide particle impregnation, the machining is not possible by conventional tools and techniques. Also, the question of the seam sealing ring is not resolved. In fact, use of exotic seam sealing techniques like laser and electron beam welding are inappropriate due to blow outs and uneven welding resulting from the beam striking carbide particles.

Electronic packages are usually produced from monolithic metals and alloys. The materials chosen are such that they offer reasonable compromise of thermal dissipation expansion match with ceramics, strength, reduced weight and glass sealability. In packages requiring high power dissipation or large size, these compromises are unacceptable. Such packages are then produced by choosing different metals and alloys as different components of the package and brazing them together to produce a configuration well suited to specific needs. Such packages, however suffer from poor integrity and high cost. Integrity is affected by long term unreliability of brazed joints which compromise the hermetic seal of the packages.

In order to improve package performance, the materials industry has been developing metal matrix materials. These materials are metals having non-metallic particles homogeneously dispersed through them, creating unique characteristics in the material. These particles can be graphite or ceramic, such as silicon carbide, baron, nitride, etc. which are impregnated within copper and aluminum or other alloys. The particles can be in fiber or particulate form. The principle behind the metal matrix materials is that the non-metals or ceramics, which generally have lower coefficient of thermal expansion and in some cases higher thermal conductivity, restrict the expansion of the parent metal or alloy. The amount of non-metal or ceramic loading determines the final characteristics of the product and hence can be tailored to a specific need.

The disadvantage, however, is that these materials are not solderable, brazeable or weldable. Resistance welding will not obtain a good joint due to high thermal conductivity of the composite. Laser welding causes dissociation of non-metal or ceramic particulate when the laser beam strikes it. This dissociation results in formation of gases which are entrapped within the weld resulting in loss of hermeticity and unreliable joint.

In the current art of building electronic packages, copper or aluminum alloys are machined to produce a package consisting of a base, side walls and holes drilled in the side walls for installing feed-troughs. The feed-throughs consist of a Kovar lead, with glass sealed to the inner diameter of a Kovar or nickel-iron alloy ring. The glass sealing in the feed-throughs electrically separates the leads from the body, as well as insuring a hermetic seal. The packages are typically plated with silver or gold with a nickel underlayer. The electroplating serves the purpose of providing solderability/brazeability to the packages along with offering corrosion protection. These machined and electroplated packages are then installed with feed-throughs by using gold-tin or gold-germanium braze alloys to braze the inside of the plated hole and outside of the Kovar or nickel-iron ring of the feed-through. An electroplated seal ring consisting of Kovar or stainless steel is also brazed to provide seam sealing capability for the cover at the same time the feed-throughs are brazed. Brazing of Kovar or the stainless steel seam sealing ring presents a problem due to voids and leaching of electroplated material at the brazing temperature, often resulting in leaky packages.

The package now is ready to accept a circuit carrying ceramic card. In some cases, the ceramic cards are soldered or attached by epoxy onto a carrier plate of intermediate expansion prior to epoxying/soldering the carrier plate inside the package. The carrier plate minimizes the effect of expansion mismatch between the package and the ceramic card and tends to prevent the warping or cracking of the ceramic card and in some cases the detachment of ceramic card from the base of the package. This is because copper and aluminum and its alloys have a high coefficient of thermal expansion (aluminum @22 ppm/°C. and copper @16 ppm/°C.) compared to the ceramic card at 7 ppm/°C.). The disadvantages of carrier plates is in additional weight and barrier to thermal dissipation.

Patents which are relevant to the invention are as follows:

Glickman U.S. Pat. No. 3,320,351 discloses a housing to electrically isolate separate miniature circuits, one from the other.

Le Gales U.S. Pat. No. 3,826,953 discloses a case having a metallic base and cover separated from each other by a hollow insulating body to form a receptacle. An intermediary support can be located inside the receptacle and carry a number of the semiconductor devices which are added to those which are normally soldered to the base of the case.

Benjamin U.S. Pat. No. 3,936,864 discloses a microwave transistor package which will dissipate maximum power and has a ceramic mounting pad brazed to an underlying copper base and has a nickel apertured plate mounted around the mounting pad. The entire package can be hermetically sealed.

Frazee et al. U.S. Pat. No. 3,943,557 discloses a cobalt oxide humidity sensor of reduced resistivity within a hermetically sealed semiconductor package.

Scherer U.S. Pat. No. 4,266,089 discloses a flat package for micro-circuits with a copper bottom and stainless steel frame for good heat transfer.

Scherer et al. U.S. Pat. No. 4,649,229 discloses a flat package for electric micro-circuits that has an iron-nickel-cobalt alloy frame which is brazed to a molybdemum bottom, and has successive layers of copper, nickel and gold plating.

Bigler et al. U.S. Pat. No. 4,760,440 discloses a package to mount a CCD image sensor, with a minimum amount of expansion or contraction, on a silicon substrate.

Knop et al. U.S. Pat. No. 3,614,827 is a recently expired patent which shows a particular process for explosively bonding dissimilar metals to each other.

DISCLOSURE OF THE INVENTION

In accordance with one form of the present invention a microwave package having controlled heat expansion characteristics is provided. This package includes a block of aluminum or aluminum alloy having a base on one side and being relieved on the opposite side to form a receptacle with a bottom and open top having a peripheral edge. A first layer of material having a low coefficient of thermal expansion in comparison to the block is explosively bonding to the base of the block. A second layer of material having a low coefficient of thermal expansion in comparison to the block extends across the top and is explosively bonded to the peripheral edge. Feed-through openings which communicate with the receptacle can be provided either through the side wall of the block or through the second layer. A cover made of the same material as the second layer extends across and is welded to the second layer. A ceramic substrate is attached to the bottom of the receptacle. The first and second layers can be made of Kovar and/or Invar. A wire extends through each of the feed-through openings and glass can surround each of the wires and hermetically seal the wires around the respective openings. If desired a first interliner can be provided between the first layer and the base of the block and a second interliner can be provided between the second layer and the peripheral edge of the block which can be made of any one of pure aluminum, titanium, tantalum and silver.

The microwave package described above can be made by explosively bonding a layer of material to opposite side of a block of aluminum or aluminum alloy, each of the layers being of a material having a low coefficient of thermal expansion in comparison to the block. Machining can then be done through one of the layers so that material is removed from the block to form a receptacle therein. Lead holes can be provided in the side of the block or one of the layers, the ceramic substrate can be attached to the bottom of the receptacle and feed wires can be extended through the lead holes. A cover can be placed over the layer at the opening and made of the same material as the layer and hermetically sealed thereto, as by welding.

The block can be in the form of an elongated bar and a plurality of receptacles can be machined into the bar simultaneously or sequentially whereupon the bar can be cut between the receptacles to form separate microwave packages.

In accordance with another form of the present invention, an electronic package having metal matrix material with controlled coefficient of thermal expansion and superior thermal dissipation characteristic is provided. This package includes a block of metal matrix material having a base on one side and being relieved on the opposite side to form a receptacle with a bottom and top having a peripheral edge. A layer of material having the required resistance or laser weldable features in comparison to the block is explosively bonded to the top peripheral edge of the block. Feed-through openings which communicate with the receptacle can be provided through the side wall of the block. A ceramic card carrying electronic components and circuit traces is attached to the bottom of the receptacle. A cover made of the same or other preferred materials as the top explosively bonded layer can be welded to the peripheral edge of the top layer. This completes the fabrication and sealing of an electronic package. The block can be in the form of an elongated bar with a plate of explosively bonded homogeneous metal explosively bonded to the top surface and a plurality of receptacles can be machined into a bar through the plate simultaneously or sequentially. Thereafter, the receptacles can be cut apart to form separate electronic packages.

The advantages of this invention are readily apparent. In one form of the invention, a microwave package can be provided which has the heat conductivity of aluminum but a reduced coefficient of thermal expansion due to the clading of materials to opposite sides of the microwave package which have very low coefficients of thermal expansion. This minimizes the assembly and expansion problems previously described. In another form of the invention, an electronic package is provided which has the properties of metal matrix materials but the weldability or joinability of conventional materials.

Additional advantageous of this invention will become apparent from the description which follows, taken in conjunction with the accompanying drawings.

BRIEF DESCRIPTION OF THE DRAWINGS

FIG. 1 is a diagrammatic perspective view showing layers of material being explosively clad to a bar of aluminum or aluminum alloy;

FIG. 2 is perspective view of the composite bar formed in FIG. 1;

FIG. 3 is an enlarged perspective view of the bar after it has been milled to form a series of receptacles;

FIG. 4 is a perspective view of one of the receptacles cut from the bar of FIG. 3;

FIG. 5 is a perspective view similar to FIG. 4, but showing the feed-through openings in the side wall of the receptacle;

FIG. 6 is an enlarged perspective view, similar to FIG. 5, but showing ceramic substrates in place and the feed-through wires extending through and hermetically sealed within the feed-through openings;

FIG. 7 is a horizontal section, taken along line 7—7 of FIG. 6, showing further detail of the package;

FIG. 8 is a perspective view of the microwave package showing the lid in place;

FIG. 9 is a fragmentary perspective view showing an alternative embodiment wherein the feed-through openings are in the layer of clad material;

FIG. 10 is a perspective view of a composite bar for manufacturing a matrix electronic package;

FIG. 11 is a perspective view of one receptacle cut from the composite bar of FIG. 10;

FIG. 12 is an enlarged perspective view, similar to FIG. 11, but showing the ceramic substrates in place and the feed-through wires extending through and hermetically sealed within the feed-through openings;

FIG. 13 is a horizontal section, taken along line 13—13 of FIG. 12, showing further details of the package; and FIG. 14 is a perspective view of the microwave package showing the lid in place.

BEST MODE FOR CARRYING OUT THE INVENTION

In accordance with one form of this invention, a microwave package can be made which includes a body of aluminum clad with thin layers of Kovar or Invar or other material having a low coefficient of thermal expansion. The average expansion of the package is a function of the volume of the individual materials which form the completed microwave package. Aluminum is a good material to use because of its low weight and good thermal dispassion. However, its coefficient of thermal expansion is quite high, i.e., 22 ppm/°C. On the other hand, Kovar, a well-known commercial alloy consisting of iron-nickel-cobalt or Invar, alloy of iron-nickel, has a low coefficient of thermal expansion. For example, stainless steel has a coefficient of 12 ppm/°C.; Kovar has a coefficient of thermal expansion of 7 ppm/°C. and Invar has a coefficient of thermal expansion of less than 1 ppm/°C. However, these materials are quite heavy and the latter two do not readily dissipate heat.

As best seen FIGS. 1 and 2, a bar 10 of aluminum can be clad on opposite sides with a bottom layer 12 and an upper layer 14, which may be Kovar or Invar. These layers can vary in thickness, but a thickness of between 40 and 50 mils has been found to be satisfactory. These layers may be clad to the aluminum bar by explosive bonding under techniques well-known in the explosive bonding art. Explosives in the form of chemical powder are placed equally on both the sides of the assembly and detonated. The momentum imparted on each outside material layer produces a metallurgical bond which is also hermetic in nature. In some situations where some aluminum alloys, due to precipitates inside them, are difficult to hermetically attach, the use of easily bondable interliner like pure aluminum, titanium, tantalum or silver is commonly used. In this situation, a five layer composite is assembled and explosively attached.

As seen in FIG. 3, the composite bar can be milled through top layer 14 so as to form a plurality of receptacles 16 so that upper layer 14 now forms a rim around the upper edge of each receptacle. The machining is performed such a way that a thin layer of aluminum is left in tact under the cavity of the package. The bottom layer of Kovar or Invar, as shown in FIG. 3, remain unmachined and primarily adds to the overall strength of the package and restricts the expansion of aluminum. The machined package is now ready for conventional electroplating and feed-through brazing/soldering. The composite construction in FIG. 3 can be cut between each receptacle to form separate microwave packages as shown in FIG. 4. Each package has a flange 18 extending from opposite sides thereof. Holes 20 can be drilled in each corner, as shown, for attachment of the microwave base within a piece of equipment. Conveniently, the receptacle 16 has a bottom or base 22, side walls 24 and end walls 26.

Next, feed-through openings 28 are drilled through side walls 24, as shown. Conveniently, feed-through wires 30 extend through each opening 28. The wires 30 can be sealed within feed-through openings 28 by means of a glass or ceramic seal 32. Substrates, such as substrates 34 and 36 can be attached to the aluminum floor 22 of receptacle 16, as by adhesive in the form of an epoxy. The ceramic substrate has a coefficient of thermal expansion of 7 ppm/°C., about the same as layers 12 and 14. Although the substrates are connected to the aluminum base 22, the expansion of the base will be greatly limited by the adjacent clad layer 12.

These substrates contain circuit boards which are connected to wires 30, as by connectors 38. After all of the electrical connections are made between wires 30 and substrates 34 and 36, a cover 40 can be welded in place around layer 14. Conveniently, cover 40 will be made of the same material as layer 14, i.e., Kovar or Invar which can be welded and hermetically sealed quite easily, as compared to aluminum.

An alternative embodiment is shown in FIG. 9 wherein the aluminum layer 10' is thinner than aluminum 10 of the previous embodiment and top layer 14' is thicker, such as on the order of 200 to 250 mils. This provides sufficient space for feed-through openings 28' to be placed in the layer 14' rather than through the aluminum layer. With this arrangement there is less expansion of openings 28' due to thermal expansion of layer 14' than there would be with aluminum layer 10'. This makes it easier to be sure that a hermetic seal is maintained between the wires 30 and the openings 28'.

In accordance with another form of this invention, a metal matrix bar 42 has a top layer 44, such as copper or aluminum, explosively clad thereto. Bar 40 can be composed of a base metal which could be copper or aluminum which has graphite or ceramic particles, such as silicon, carbide, boron or nitride which are homogeneously mixed through the base metal. These particles alter the characteristics of the base metal, such as a lower coefficient of thermal expansion or increasing thermal conductivity. Also, the strength of the material can be increased. The desired characteristics can be increased by adding more of the non-metallic particles or decreased by decreasing the amount of non-metallic particles. By way of example a receptacle has been constructed using 40–50% fill silicon carbide impregnated aluminum 6061 matrix with a layer of stainless steel bonded thereto with an inner liner of aluminum alloy between the matrix and the stainless steel layer.

Portions of the bar can be milled out simultaneously or sequentially through top layer 44 to form receptacles which can be separated, as described in the previous embodiments so as to form individual receptacles, such as receptacle 46, shown in FIG. 11. Conveniently, the receptacle 46 has a bottom or base 48, side walls 50 and end walls 52. Holes 54 can be drilled in each corner of flanges 56, as shown, for attachment of the electronic package base within a piece of equipment.

As best seen in FIG. 12, feed-through openings 58 are drilled through side walls 50. Advantageously, feed-through wires 60 extend through each opening 58. Wires 60 can be sealed within feed-through openings 58 by means of a glass or ceramic seal 62. Substrates, such as substrates 64 and 66 can be attached to the matrix floor 48 of receptacle 46, as by an epoxy adhesive.

These substrates contain circuit boards which are connected to wires 60, as by connectors 68. After all of the electrical connections are made between wires 60 and substrates 64 and 66, a cover 70 can be welded in place around layer 44. Conveniently, cover 70 will be made of the same material as layer 14, i.e., aluminum or copper which can be welded and hermetically sealed quite easily.

From the foregoing, the advantages of this invention are readily apparent. In one form of the invention, microwave package has been made which is of simple construction yet because it is made of aluminum clad with a material having a lower coefficient of thermal expansion, the microwave package can be made in larger sizes than heretofore possible without exceeding the expansion capabilities of the ceramic substrates placed within them. Furthermore, the clad material is easier to weld than the aluminum. In other words, the advantages of both materials are maintained. The aluminum provides great thermal conductivity but the clad material limits the expansion of the aluminum material, while providing a suitable material for welding a cover in place so as to improve the possibility of a good hermetic seal.

In alternative form of the invention, a metal matrix material can be used which has a layer of copper or aluminum clad to the top surface. The microwave package is formed by milling away a portion of this top surface to form the container. A top cover is provided which is of the same material as the clad layer which facilitates easy welding or attachment thereto.

This invention has been described in detail with reference to particular embodiments thereof, but it will be understood that various other modifications can be effected within the spirit and scope of this invention.

I claim:

1. A microwave package having controlled heat expansion characteristics, said package comprising:
   a block of aluminum or aluminum alloy having a base on one side and being relieved on the opposite side to form a receptacle with a bottom and an open top having a peripheral edge;
   a first layer of material having a low coefficient of thermal expansion in comparison to said block explosively bonded to said base of said block;
   a second layer of material having a low coefficient of thermal expansion in comparison to said block extending across said top and explosively bonded to said peripheral edge;
   feed-through openings communicating with said receptacle; and
   a cover made of the same material as said second layer extending across and welded to said second layer.

2. Apparatus, as claimed in claim 1, wherein:
   said first and second layer and said cover are an alloy selected from the group consisting of Iron, Nickel and Cobalt.

3. Apparatus, as claimed in claim 1 wherein:
   said first and second layer and said cover have a coefficient of thermal expansion which does not exceed 7 ppm/°C.

4. Apparatus, as claimed in claim 1, further including:
   a first interliner between said first layer and said base of said block; and
   a second interliner between said second layer and said peripheral edge of said block, said first and second interliners being any one of pure aluminum, titanium, tantalum and silver.

5. Apparatus, as claimed in claim 1, wherein:
   said feed-through openings are in an aluminum side wall formed in said block.

6. Apparatus, as claimed in claim 1, wherein:
   said feed-through openings are in said second layer.

7. A matrix electronic package having controlled heat expansion characteristics, said package comprising:
   a block of metal matrix material having a base on one side and being relieved on the opposite side to form a receptacle with a bottom and an open top having a peripheral edge;

a layer of weldable material extending across said top and explosively bonded to said peripheral edge;
feed-through openings communicating with said receptacle; and
a cover made of the same material as said layer extending across and sealed to said layer by welding.

8. Apparatus, as claimed in claim 7, wherein:
said layer and said cover are metal selected from the group consisting of copper and aluminum.

9. Apparatus, as claimed in claim 7, wherein: said matrix material is metal having non-metal particles homogeneously disbursed therethrough.

10. Apparatus, as claimed in claim 9, wherein:
said metal is a metal selected from the group consisting of copper and aluminum; and said particles are ceramic.

11. Apparatus, as claimed in claim 7, wherein:
said feed-through openings are in the matrix material side wall formed in said block.

12. Apparatus, as claimed in claim 7, wherein:
said feed-through openings are in said layer.

* * * * *